United States Patent [19]

Keller

[11] Patent Number: 4,579,719

[45] Date of Patent: Apr. 1, 1986

[54] APPARATUS FOR CRUCIBLE-FREE FLOATING-ZONE MELTING A SEMICONDUCTOR ROD, PARTICULARLY OF SILICON

[75] Inventor: Wolfgang Keller, Munich, Fed. Rep. of Germany

[73] Assignee: Siemens Aktiengesellschaft, Berlin and Munich, Fed. Rep. of Germany

[21] Appl. No.: 521,384

[22] Filed: Aug. 8, 1983

[30] Foreign Application Priority Data

Aug. 6, 1982 [DE] Fed. Rep. of Germany ....... 3229461

[51] Int. Cl.$^4$ .......................... H05B 6/36; C30B 13/20
[52] U.S. Cl. ................................... 422/250; 219/10.75
[58] Field of Search .................. 422/250; 156/620; 219/10.43, 10.49 R, 10.75, 10.79, 10.77

[56] References Cited

U.S. PATENT DOCUMENTS

| | | | |
|---|---|---|---|
| 3,644,151 | 2/1972 | Keller | 148/1.6 |
| 3,827,017 | 7/1974 | Keller | 219/10.43 X |
| 3,985,947 | 10/1976 | Keller | 219/10.77 |
| 4,017,701 | 4/1977 | Mittelmann | 219/10.49 |
| 4,220,839 | 9/1980 | DeLeon | 219/10.49 R |

FOREIGN PATENT DOCUMENTS

| | | |
|---|---|---|
| 2357688 | 5/1975 | Fed. Rep. of Germany ... 219/10.79 |
| 2425468 | 5/1978 | Fed. Rep. of Germany . |
| 2739060 | 3/1979 | Fed. Rep. of Germany . |
| 2938348 | 4/1981 | Fed. Rep. of Germany . |

Primary Examiner—Hiram H. Bernstein
Attorney, Agent, or Firm—Herbert L. Lerner; Laurence A. Greenberg

[57] ABSTRACT

Apparatus for crucible-free zone melting an end-supported semiconductor rod, including an RF generator having a resonant circuit for determining the generator frequency, the resonant circuit having connected therein a tank-circuit coil and a tank-circuit capacitor, and an induction heating coil fed by the RF generator and annularly surrounding the semiconductor rod, the tank-circuit coil being formed as a primary winding to the induction heating coil acting as a secondary winding, both the tank circuit coil and the induction heating coil forming a structural unit having a fixed magnetic coupling.

20 Claims, 3 Drawing Figures

APPARATUS FOR CRUCIBLE-FREE FLOATING-ZONE MELTING A SEMICONDUCTOR ROD, PARTICULARLY OF SILICON

The invention relates to apparatus for crucible-free floating-zone melting a semiconductor rod, preferably of silicon, held at the ends thereof and, more particularly, to such apparatus having an RF or high frequency generator with a resonant circuit including a tank coil and capacitor determining the generator frequency, and an induction heating coil which is fed by the RF generator and annularly surrounds the semiconductor rod.

In producing silicon by crucible-free zone melting, a silicon rod is clamped vertically in a vessel which is evacuated or filled with a protective gas and is heated inductively by means of a coil which annularly surrounds the silicon rod. The melting zone thus formed is slowly passed through the rod in one direction.

From German Published Prosecuted application (DE-AS) No. 24 25 468, a zone melting method is known wherein an induction heating coil which annularly surrounds a semiconductor rod and is spaced therefrom is supplemented by a capacitor shunted there-across to form an electric resonant heating circuit and wherein this resonant heating circuit is supplied via a coaxial cable and at least one variable coupling element from a high-frequency generator supplying an a-c voltage of variable frequency. In this method, the output of a high-frequency generator is fed to a resonant or tank circuit having a variable setting of the output frequency. The output frequency is set by means of a capacitor of the output tank circuit having an adjustable capacitance. The resonant heating circuit formed by the induction heating coil and a capacitor shunted across it is coupled to the RF generator via a high-frequency line, a capacitive coupling member and a coupling output coil which, in turn, together with the induction coil of the resonant output circuit of the high-frequency generator, forms a transformer with a variable degree of coupling.

At initiation of the crucible-free zone melting process, the melting zone is generally formed first at the boundary between a monocrystalline seed crystal and the silicon rod to be converted into a single crystal. Ordinarily, the diameter of the seed crystal is many times smaller than that of the rod to be remelted. For this reason, a gradual transition of the diameter of the melting zone from that of the seed crystal to that of the rod to be melted is provided. Because the diameter of the induction heating coil remains unchanged, a considerable variation in the mutual inductance between the induction heating coil and the silicon rod occurs during the passage or shift of the melting zone from the boundary to the seed crystal into the silicon rod to be melted. The mutual inductance and the coupling of the silicon rod to the induction heating coil increase with increasing diameter of the rod. Generally, this results in considerable variations in the current generated in the melting zone.

In order to counteract this, it is possible to ensure, in a band filter circuit such as is known from German Published Prosecuted Application (DE-AS) No. 24 25 468, by continuous readjustment of the output coupling of the resonant heating circuit that an optimum operating point of the resonant heating circuit will exist at every instant of the process. Such a readjustment is difficult to accomplish, however, due to the overcritical coupling especially in the case of large load variations such as occur in crucible-free zone melting of semiconductor rods with diameters greater than 50 mm. Dispensing with readjustment of the coupling, on the other hand, requires a large amount of technical means with respect to cooling the individual circuit components, especially the connecting cable between the RF-generator and the resonant heating circuit.

These heretofore known band filter circuits which have high efficiency and deliver a sinusoidal high frequency, have a disadvantage, furthermore, in that the mechanical power control employed over the frequency is very sluggish and can lead to detrimental temperature variations in the single crystal.

It has become known heretofore, for example, from German Published Prosecuted Application (DE-OS) No. 27 39 060 to connect the parallel resonance heating circuit of zone melting system directly to the anode of the generator tube via a coupling capacitor and, due to the small inductance value of the ordinarily used induction heating coil, to construct it so that a resonant circuit coil which for electrical reasons has a large inductivity compared to that of the induction heating coil is connected in series with the induction heating coil. Apparatus operating with such a circuit, however, has the disadvantage that the voltage present at the induction heating coil is rich in harmonics and, therefore, incomparison with a resonant circuit low in harmonics, a higher voltage is required at the induction heating coil for the same heating power. Danger of the occurrence of breakdowns in the vicinity of the induction heating coil which can cause damage to the zone melting apparatus is thereby increased, however. In addition, this circuit has rather poor efficiency.

From German Published Non-Prosecuted Application (DE-OS) No. 27 39 060, a zone melting apparatus is further known which has a parallel resonant heating circuit supplied by a high-frequency generator, the inductive component of which is realized by a melting coil and a coil connected in series therewith and having an inductance which is large compared to that of the rod heating coil, and wherein the rod heating coil is shunted by a variable capacitor due to which the thus formed partial resonant circuit can be tuned to a harmonic of the fundamental frequency of the high-frequency generator. In this manner, a possibility is provided for frequency changes in this partial resonant circuit, which are caused by variations in volume of the melting zone of the melted rod to serve as starting variables for generating the actual value for the rod diameter control.

The generator circuit shown hereinafter in FIG. 1 of the drawings is described, for example, in (DE-OS) German Published Non-Prosecuted Application. As shown in FIG. 1, the output of an RF generator 1 is connected via a coupling capacitor 3 to a parallel resonant circuit formed of a tank circuit capacitor 2 and series-connected coils 4 and 5, the coil 5 being an induction heating coil surrounding the silicon rod 6, and the coil 4 being a tank circuit coil. For the purpose of matching the internal resistance of the generator tube, the coil 4 has an inductivity which is large compared to that of the induction heating coil 5, since induction heating coils generally have a low value of inductance.

Because the RF voltage of the generator 2 is very rich in harmonics due to the generally used Class C operation, the high frequency present at the induction heating coil 5 is not even approximately sinusoidal but rather rich in harmonics. As explained at the introduction hereto, the danger of breakdowns in the vicinity of the induction heating coil 5 increases, which can lead to damage to the zone melting system and to the destruction of a growing single crystal.

German Published Non-Prosecuted Application (DE-OS) No. 29 38 348 therefore provides for the attainment of a high efficiency and an approximately sinusoidal signal, in a zone melting device, by tuning the partial resonant circuit formed by the induction heating coil and the heating circuit capacitor to a frequency which deviates by less than a factor of 2 from the frequency of the RF generator.

It is an object of the invention to provide an apparatus for crucible-free zone melting wherein the difficulties which arise in more or less serious form in the power supply of the induction heating coil of previous constructions are eliminated by realizing a single-circuit induction heating system with high energy density and high efficiency, and the heretofore provided relatively expensive multi-circuit arrangement is dispensed with.

With the foregoing and other objects in view, there is provided, in accordance with the invention, an apparatus for crucible-free zone melting and end-supported semiconductor rod, including an RF generator having a resonant circuit for determining the generator frequency, the resonant circuit having connected therein a tank-circuit coil and a tank-circuit capacitor, and an induction heating coil fed by the RF generator and annularly surrounding the semiconductor rod, the tank-circuit coils and said induction heating coil being formed in a single unit and functioning as a primary winding and a secondary winding, respectively both the tank circuit coil and the induction heating coil forming a structural unit having a fixed magnetic coupling.

Due to the fact that the primary coil of the melt transformer simultaneously becomes a tank circuit coil of the generator, a very simple circuit with only few components is obtained; also, tubes as active components are relatively easy to match.

In accordance with another feature of the invention, the primary winding has from two to ten turns, preferably four turns, all of the turns being formed as tubes, for example hollow cylinders, through which a cooling liquid such as water, for example, can flow.

In accordance with a further feature of the invention, the primary turns are preferably formed of copper, silver-plated or silver-coated copper or silver and are disposed in one plane.

In accordance with additional features of the invention, the primary turns are optionally surrounded by a secondary turn acting as an energy concentrator, the energy concentrator being the secondary winding and being formed with bores through which the primary turns extend.

In accordance with an added feature of the invention, the energy concentrator is formed also with bores and recesses, respectively, for conducting cooling liquid therethrough.

In accordance with yet another feature of the invention, in order to provide a high volume or filling capacity and thereby close or great coupling between the primary and the secondary winding, the tubes forming the primary winding turns are provided with a rectangular cross section.

In accordance with yet a further feature of the invention, individual turns of the primary winding are spaced from one another and from the secondary winding turns, the spaces between the primary winding turns and between the secondary turn and all of the primary-winding turns is filled with temperature-resistant insulating material. The temperature-resistant insulating material is formed of ceramic, silicone rubber, silicone resin or polybismaleinimide.

To improve the dielectric strength, the energy concentrator of the single-turn heating coils is divided into segments.

In accordance with other features of the invention, the energy concentrator is subdivided into two, three, four or six segments and each segment is provided with potential leads in a middle region thereof. Thereby, the alternating magnetic field remains fully preserved and is transmitted to the semiconductor rod to be melted, while the electric field of the coil is correspondingly divided-down by subdividing the energy concentrator into individual segments.

In accordance with an especially advantageous embodiment of the invention, the primary turns and the energy concentrator acting as the secondary turn form a structural unit in such a manner that the segments have a thickness which increases from the radially inner to the radially outer side thereof and extends preferably conically, the segments having a thickness of about 5 to 30 mm at the radially outer side thereof.

In accordance with a more specific construction of the apparatus according to the invention, a coil has an outside diameter of the primary winding thereof of about 80 to 500 mm and is formed with a circular opening of about 20 to 40 mm defined by the segments of the energy concentrator, through which the semiconductor rod to be remelted extends. The segments which are tapered toward the center of the energy concentrator have a radius of curvature of about 0.5 to 2 mm on the radially inner side thereof.

In accordance with an added feature of the invention, the energy concentrator is formed of copper, copper with a silver coating or silver.

In accordance with a concomitant feature of the invention, if the resonant circuit is to be operated with an RF voltage having a frequency of between 1 and 10 MHz, the tank circuit capacitor is in the order of 1,000 to 10,000 pF, and the inductivity of the tank circuit coil being thereby set at between 0.03 to 30 $\mu$Hy.

Other features which are considered as characteristic for the invention are set forth in the appended claims. Although the invention is illustrated and described herein as embodied in apparatus for crucible-free floating-zone melting a semiconductor rod, particularly of silicon, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
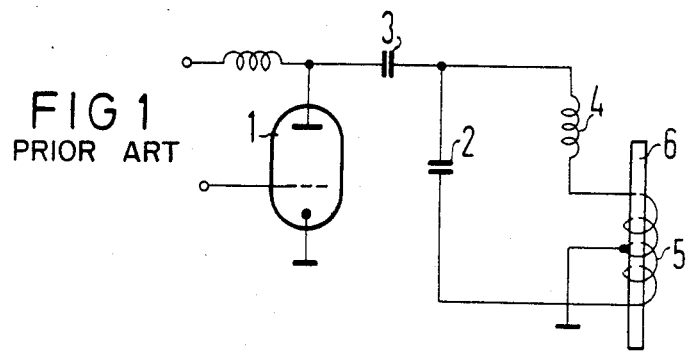
FIG. 1 is a circuit diagram which, as aformentioned, is of a prior art apparatus for crucible-free zone melting.
Figure 2:
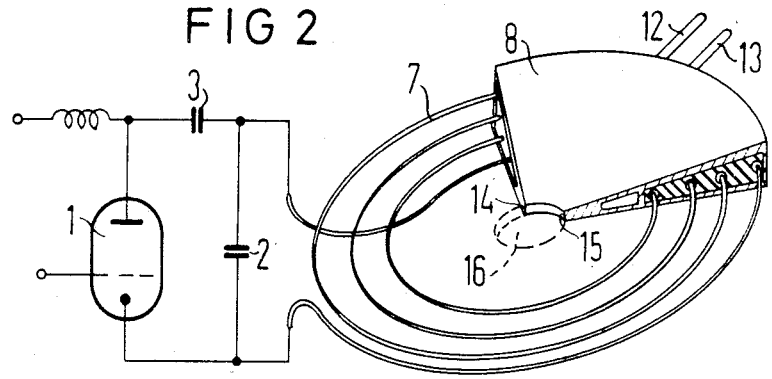
FIG. 2 is a circuit diagram, partly schematic, of the apparatus according to the invention.

Referring now again to the drawing and, more particularly to FIG. 2 thereof, there is shown a generator circuit which includes the RF generator 1, having an output which is connected via the d-c separating capacitor 3 of 10,000 pF, for example, to the tank circuit 5 which is a parallel resonance circuit. The resonance circuit includes a tank circuit capacitor 2 of 10,000 pF, for example, and a coil 7 with four turns, for example. If the coil 7 has an inductivety or inductance of about 2.5 $\mu$Hy, then the generator operates with a frequency of 1 MHz.

The tank circuit coil 7 is formed as the primary winding for a heating coil 8 which acts as the secondary winding. Thus, the RF generator is completed in principle by this measure.

In addition to the difficulties described at the introduction hereto, which are overcome by the invention of the instant application, the mechanical construction of the generator becomes very simple due to the fact that the resonant circuit coil simultaneously serves as the heating coil. The generator is inexpensive and not critical to load changes, and has very high efficiency.

Due to the elimination of many very expensive and high-quality components, such a generator is suitable in the manufacture of high-quality silicon especially with the low-cost concepts which have recently become very timely.

In practice, the the generator simplification concept requires a specially constructed heating coil which effects a matching of the high-resistance tube generator to the low-resistance semiconductor melt.

Figure 3:
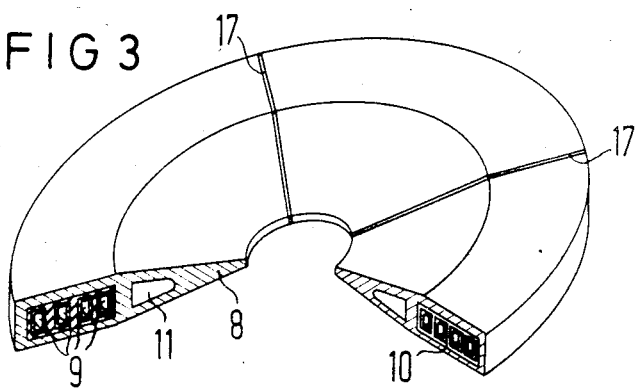
FIG. 3 is an enlarged fragmentary view of FIG. 2 showing the electric concentration in greater detail.

An example of such a tank circuit coil, which acts simultaneously as the heating coil, is shown in the arrangement according to FIG. 3.

The four turns, for example, of the primary winding 7 of the heating or tank circuit coil are disposed in one plane and are formed of rectangular copper tubes 9 disposed closely adjacent but spaced from one another. In operation, cooling water flows through the interior of the tubes.

The copper tubes 9 are insulated from one another and from the secondary turn 8 surrounding them by temperature-resistant insulating material 10, for example, of silicon rubber. The secondary turn 8 is constructed as an energy concentrator wherein the primary turns are embedded, and which is additionally formed with bores 11 through which cooling liquid flows. In the arrangement according to FIG. 2, this is indicated by the water feed tube 12 and the water discharge tube 13. The energy concentrator formed, for example, of silver-plated copper is subdivided in the embodiment of FIG. 3 into several, preferably four segments, of which only three segments are shown; it can also be constructed unsegmented, of course. For the sake of greater clarity, only one segment is shown in FIG. 2 instead of the entire energy concentrator which surrounds all of the primary turns, which FIG. 3 shows a cross section through the heating coil.

The space 17 between the segments is likewise filled with temperature-resistant insulating material, such as silicone rubber, for examples.

By subdividing the energy concentrator into several segments, it is possible to increase the dielectric strength of the heating coil considerably. If the secondary winding has a voltage of 1,000 volts, for example, as compared with that of the semiconductor rod which is at ground potential, the voltage of each segment is reduced by the corresponding fraction. If four segments are used, 250 volts are alotted to each segment. If use is made of the central grounding of each segment, the voltage which each segment has with respect to the grounded melt is halved (similar to the voltage division according to German Patent No. 19 13 88). The critical voltage between the melt and the ends of the segments is reduced again by the factor of 2; the ends referred to are the ends 14 and 15 in the segment 8 in FIG. 2.

A segment is grounded at the center in a simple manner by grounding the cooling water connections 12 and 13 which are brought into the center of the segments.

As is shown in FIGS. 2 and 3, a technically elegant construction of the invention calls for the segment to have a thickness which increases from the radially inner to the radially outer sides thereof and is preferably conical.

In practice, a coil has found acceptance wherein the circular opening 16 defined by the segments, through which the semiconductor rod to be remelted extends has a diameter of 20 to 40 mm, the heating coil having an outer diameter of 80 to 500 mm.

If the segments have a thickness of about 20 mm at the radially outer side thereof, a radius of curvature of 1 mm is maintainable at the radially inner side thereof in spite of the bores.

For zone melting semiconductor crystal rods with large rod diameters, it is also possible, in accordance with an embodiment incorporating the teachings of the invention, to construct the induction heating coil so that it is detachable, a parting line or joint going through the turns and segments and providing two separate elements which are connected to one another by screw connections and seals provided for the cooling.

The foregoing is a description corresponding, in substance to German application P 32 29 461.1, dated Aug. 6, 1983, international priority of which is being claimed for the instant application, and which is hereby made part of this application. Any material discrepancies between the foregoing specification and the specification of the afroementioned corresponding German application are to be resolved in favor of the latter.

There are claimed:

1. Apparatus for crucible-free zone melting and end-supported semiconductor rod, comprising an RF generator having a resonant circuit for determining the generator frequency, said resonant circuit having connected therein a tank-circuit coil and a tank-circuit capacitor, and an induction heating coil fed by said RF1 generator and annularly surrounding the semiconductor rod, said tank circuit coil and said induction heating coil being formed in a single unit, said tank circuit coil functioning as a primary winding, and said tank circuit coil functioning as a secondary winding, both said tank circuit coil and said induction heating coil forming a structural unit having a fixed magnetic coupling.

2. Apparatus according to claim 1 wherein said primary winding has at least two turns.

3. Apparatus according to claim 2 wherein said turns of said primary winding are formed of tubes traversible by a flow of cooling liquid.

4. Apparatus according to claim 3 wherein said turns are hollow cylinders.

5. Apparatus according to claim 3 wherein said tubes forming said primary-winding turns have a rectangular cross section.

6. Apparatus according to claim 2 wherein said primary-winding turns are formed of copper, silver-coated copper or silver.

7. Apparatus according to claim 2 wherein said primary-winding turns are disposed in a single plane.

8. Apparatus according to claim 2 wherein said heating coil is formed as a single-turn secondary winding serving as an energy concentrator surrounding said primary-winding turns.

9. Apparatus according to claim 8 wherein said energy concentrator is formed with bores through which said primary-winding turns extend.

10. Apparatus according to claim 8 wherein said energy concentrator is formed with bores for conducting a flow of cooling liquid therethrough.

11. Apparatus according to claim 8 wherein said turns of said primary winding are spaced from one another and from said secondary-winding turn, the spaces between said turns of said primary winding and between said secondary-winding turn and all of said primary-winding turns are filled with temperature-resistant insulating material.

12. Apparatus according to claim 11 wherein said temperature-resistant insulating material is formed of ceramic, silicone rubber, silicone resin or polybismaleinimide.

13. Apparatus according to claim 8 wherein said energy concentrator is subdivided into at least two segments.

14. Apparatus according to claim 13 wherein said energy concentrator is subdivided into three segments.

15. Apparatus according to claim 13 wherein said energy concentrator is subdivided into four segments.

16. Apparatus according to claim 13 wherein said energy concentrator is subdivided into six segments.

17. Apparatus according to claim 13 wherein each of said segments has potential terminals in a middle region thereof.

18. Apparatus according to claim 13 wherein said segments have a thickness increasing from the radially inner to the radially outer side thereof.

19. Apparatus according to claim 1 wherein said tank-circuit capacitor has a capacitance of about 1000 to 10,000 pF.

20. Apparatus according to claim 1 wherein said tank-circuit coil has an inductance of about 0.03 to 30 $\mu$Hy.

* * * * *